(12) United States Patent
Van Den Akker et al.

(10) Patent No.: US 9,655,222 B2
(45) Date of Patent: May 16, 2017

(54) RADIATION SOURCE

(75) Inventors: Jeroen Van Den Akker, Goirle (NL); Antonius Theodorus Wilhelmus Kempen, Rosmalen (NL); Adriaan Cornelis Kuijpers, Goirle (NL)

(73) Assignee: ASML Netherlands B.V., Veldhoven (NL)

( * ) Notice: Subject to any disclaimer, the term of this patent is extended or adjusted under 35 U.S.C. 154(b) by 404 days.

(21) Appl. No.: 13/599,494

(22) Filed: Aug. 30, 2012

(65) Prior Publication Data

US 2013/0077071 A1    Mar. 28, 2013

Related U.S. Application Data

(60) Provisional application No. 61/538,680, filed on Sep. 23, 2011.

(51) Int. Cl.
| | | |
|---|---|---|
| G03F 7/20 | (2006.01) | |
| G03B 27/42 | (2006.01) | |
| H05G 2/00 | (2006.01) | |

(52) U.S. Cl.
CPC ......... *H05G 2/005* (2013.01); *G03F 7/70033* (2013.01); *H05G 2/006* (2013.01); *H05G 2/008* (2013.01); *Y10T 29/49815* (2015.01); *Y10T 29/49817* (2015.01); *Y10T 29/49826* (2015.01); *Y10T 29/49865* (2015.01)

(58) Field of Classification Search
CPC ............ G03F 7/70916; G03F 7/70033; G03F 7/70925; G03F 7/70908; G03F 7/70008
USPC ............................................. 355/53, 67, 71
See application file for complete search history.

(56) References Cited

U.S. PATENT DOCUMENTS

| 5,415,772 | A | 5/1995 | Garcera et al. |
| 6,082,175 | A * | 7/2000 | Yoshikawa et al. ......... 73/23.31 |
| 6,210,458 | B1* | 4/2001 | Shindo et al. .................. 55/486 |
| 6,647,088 | B1 | 11/2003 | Schmidt et al. |
| 6,835,944 | B2 | 12/2004 | Orsini et al. |
| 7,141,806 | B1 | 11/2006 | Partlo et al. |
| 7,365,350 | B2 | 4/2008 | Tran et al. |
| 7,405,416 | B2 | 7/2008 | Algots et al. |
| 7,782,245 | B2 | 8/2010 | Pearson et al. |

(Continued)

FOREIGN PATENT DOCUMENTS

| CN | 1379968 A | 11/2002 |
| CN | 101715568 A | 5/2010 |

(Continued)

*Primary Examiner* — Mesfin Asfaw
(74) *Attorney, Agent, or Firm* — Sterne, Kessler, Goldstein & Fox P.L.L.C.

(57) ABSTRACT

According to a first aspect of the present invention, there is provided a radiation source comprising: a reservoir configured to retain a volume of fuel; a nozzle, in fluid connection with the reservoir, and configured to direct a stream of fuel along a trajectory towards a plasma formation location; a laser configured to direct laser radiation at the stream at the plasma formation location to generate, in use, a radiation generating plasma; and a contamination filter assembly located in a fuel flow path of the radiation source, upstream of a nozzle outlet, a filter medium of that contamination filter assembly being held in place within the contamination filter assembly by a clamping force provided by one or more objects that at least partially surround the filter medium.

20 Claims, 5 Drawing Sheets

(56) References Cited

U.S. PATENT DOCUMENTS

| | | | |
|---|---|---|---|
| 8,610,095 B2 | 12/2013 | Yabu et al. | |
| 2005/0016268 A1* | 1/2005 | Hugill | G01V 7/02 73/382 R |
| 2006/0255298 A1 | 11/2006 | Bykanov et al. | |
| 2007/0023693 A1 | 2/2007 | Bakker et al. | |
| 2007/0075012 A1 | 4/2007 | Estochen et al. | |
| 2008/0122311 A1* | 5/2008 | Werst et al. | 310/217 |
| 2008/0309893 A1 | 12/2008 | Buis et al. | |
| 2009/0230326 A1* | 9/2009 | Vaschenko et al. | 250/492.2 |
| 2011/0109892 A1 | 5/2011 | Van Herpen et al. | |

FOREIGN PATENT DOCUMENTS

| | | |
|---|---|---|
| CN | 101978792 A | 2/2011 |
| CN | 102084299 A | 6/2011 |
| DE | 10237901 B3 | 5/2004 |
| JP | H06262064 | 9/1994 |
| JP | 2004-134363 A | 4/2004 |
| JP | 2008532286 | 8/2008 |
| JP | 2008532293 | 8/2008 |
| JP | 2009-500795 A | 1/2009 |
| JP | 2010199560 | 9/2010 |
| JP | 4696019 B2 | 6/2011 |
| WO | WO 2012161860 | 11/2012 |

\* cited by examiner

RADIATION SOURCE

CROSS REFERENCE TO RELATED APPLICATIONS

This application claims the benefit under 35 U.S.C. §119 (e) to U.S. Provisional Patent Application No. 61/538,680, filed Sep. 23, 2011, which is incorporated by reference herein in its entirety.

BACKGROUND

Field of the Invention

The present invention relates to a radiation source, suitable for use in conjunction with, or forming part of, a lithographic apparatus and more generally to a fluid stream generator.

Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles (i.e., droplets) of a suitable fuel material (e.g., tin, which is currently thought to be the most promising and thus likely choice of fuel for EUV radiation sources), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure (e.g., a housing or chamber) arranged to provide a vacuum environment to support the plasma. Such a radiation system is typically termed a laser produced plasma (LPP) source. In an alternative system, which may also employ the use of a laser, radiation may be generated by a plasma formed by the use of an electrical discharge, e.g., a discharge produced plasma (DPP) source.

Some LPP radiation sources generate a continuous stream of fuel droplets. In such a system, the radiation source comprises a nozzle for directing fuel droplets toward a plasma formation location. The droplets need to be directed to the plasma formation location with a high degree of accuracy in order to ensure that a laser beam may be directed toward and into contact with the droplets. However, in order to achieve this, the fuel should pass through the nozzle without encountering any unexpected or unintentional obstructions or restrictions. Such obstructions or restrictions may result from contamination in the fuel being deposited on an internal surface of the nozzle. The contamination can result in a stream of droplets directed by the nozzle not having one or more required properties, for example a desired trajectory or a desired droplet size, shape or frequency. As a result, this can lead to the radiation source as a whole not functioning as intended. For example, the system may not be able to generate radiation, or not be able to generate radiation of the required intensity or for a required duration.

Although the above problems have been described in relation to nozzles used in LPP radiation sources, the same or similar problems may be encountered in conjunction with nozzles used in other fluid (e.g., liquid) stream generators (droplet or continuous), for example, nozzles used in ink jet and/or (molten) metal printing or the like. Also, the problems are not restricted to a stream comprising droplets as the same or similar problems may be encountered when a continuous stream is to be generated.

SUMMARY

Therefore, what is needed is an effective system and method to obviate or mitigate the effect of unexpected or unintentional obstructions or restrictions that are a result of contamination in fuel being deposited on an internal surface of a nozzle, such as a nozzle used in an LPP radiation source.

In an embodiment of the present invention, there is provided a radiation source including a reservoir configured to retain a volume of fuel, a nozzle in fluid connection with the reservoir in order to direct a stream of fuel along a trajectory towards a plasma formation location. The radiation source further includes a laser configured to direct laser radiation at the stream at the plasma formation location to generate a radiation generating plasma, and a contamination filter assembly located in a fuel flow path of the radiation source, upstream of a nozzle outlet, where a filter medium of that contamination filter assembly is held in place within the contamination filter assembly by a clamping force provided by one or more objects that at least partially surround the filter medium.

In an embodiment, the filter medium may be held in place by one or more objects that have been shrink fitted to surround and apply the clamping force to the filter medium.

In an embodiment, the one or more surrounding objects may be one or more of, or a combination of: a component of the contamination filter assembly; an inlet of the contamination filter assembly; an outlet of the contamination filter assembly; a filter medium housing of the contamination filter assembly; and/or a conduit for carrying fuel.

In an embodiment, the filter medium may be or may comprise one or more of: a ceramic material; a ceramic material being or comprising zirconia; a ceramic material being or comprising alumina; a ceramic material being or comprising silicon-carbide; and/or a ceramic material being or comprising silicon-nitride.

According to an embodiment of the present invention, there is provided a fluid stream generator, including a reservoir configured to retain a volume of fluid, a nozzle in fluid connection with the reservoir in order to direct a stream of fluid along a trajectory. The fluid stream generator further includes a contamination filter assembly located in a fluid flow path of the fluid stream generator, upstream of a nozzle outlet, where a filter medium of that contamination filter assembly is held in place within the contamination filter assembly by a clamping force provided by one or more objects that at least partially surround the filter medium.

According to an embodiment of the present invention, there is provided a method of incorporating a filter medium in a contamination filter assembly of a fluid stream generator. The method includes clamping the filter medium in position using one or more objects that, during use of the contamination filter assembly, would at least partially surround the filter medium and maintain a clamping force.

In an embodiment, the method can include heating the one or more objects that would, during use of the contamination filter assembly, at least partially surround the filter medium, in order to cause expansion of those one or more objects to an extent that allow a filter medium to be located in a position whereby the one or more objects surround the filter medium. The method includes locating the filter medium in that position, and cooling, or allowing to cool, the one or more objects that surround the filter medium, such that the one or more objects that at least partially surround the filter medium apply a clamping force to the filter medium.

In an embodiment, the heating that is required to expand the one or more objects to allow the medium to be located in the afore-mentioned position, can be to a temperature in excess of an operating temperature of the filter, such that the clamping force is maintained during operation of the filter.

According to an embodiment of the present invention, there is provided a method of removing a filter medium from a contamination filter assembly of a fluid stream generator filter, the filter medium being clamped in position within the filter assembly by one or more objects that at least partially surround the filter medium. Furthermore, the method includes removing a clamping force provided by the one or more objects that at least partially surround the filter medium; and removing the unclamped filter medium.

In an embodiment, the method can include heating the one or more objects that at least partially surround the filter medium, in order to cause expansion of those one or more objects to an extent that allows removal of the filter medium, and removing the filter medium.

According to an embodiment of the present invention, there is provided a radiation source including a reservoir configured to retain a volume of fuel, a nozzle in fluid connection with the reservoir and configured to direct a stream of fuel along a trajectory towards a plasma formation location. The radiation source also includes a laser configured to direct laser radiation at the stream at the plasma formation location to generate a radiation generating plasma, and a contamination filter assembly located in a fuel flow path of the radiation source, upstream of a nozzle outlet, where a filter medium of that contamination filter assembly includes a ceramic material.

In an embodiment, the filter medium can be located within a filter medium housing of the contamination filter assembly. One or more internal surfaces of that housing can be provided with and/or comprise ceramic material. For example, the ceramic material may be provided in the form of a ceramic coating (which could be achieved by forming one or more walls from that ceramic, or coating another material with the ceramic) or a ceramic insert.

In an embodiment, the filter medium and/or the ceramic coating or insert, can include a ceramic material that includes zirconia, alumina, silicon-carbide, or silicon-nitride.

In an embodiment, the filter medium may be held in place within the contamination filter assembly by a clamping force provided by one or more objects that at least partially surround the filter medium.

In an embodiment, the filter medium may be held in place by one or more objects that have been shrink fitted to surround and apply the clamping force to the filter medium.

According to an embodiment of the present invention, there is provided a fluid stream generator, including a reservoir configured to retain a volume of fluid, a nozzle in fluid connection with the reservoir and configured to direct a stream of fluid along a trajectory. The fluid stream generator further includes a contamination filter assembly located in a fluid flow path of the fluid stream generator, upstream of a nozzle outlet, where a filter medium of that contamination filter assembly includes a ceramic material.

In an embodiment, the fuel or fluid may be a molten metal.

In an embodiment, the filter assembly may be located between the reservoir and a nozzle outlet.

In an embodiment, the filter medium may at least partially extend in a direction substantially parallel to a direction of fuel or fluid flow.

In an embodiment, a ceramic slurry or polyimide seal may be located in-between the filter medium and one or more surrounding objects.

In an embodiment, the filter medium may have an average pore (i.e., gauge) size of less than or equal to 20 µm, less than or equal to 5 µm, or less than or equal to 1 µm.

According to an embodiment of the present invention, there is provided a lithographic apparatus including an illumination system for providing a radiation beam, a patterning device for imparting the radiation beam with a pattern in its cross-section, a substrate holder for holding a substrate. The lithographic apparatus also includes a projection system for projecting the patterned radiation beam onto a target portion of the substrate, and wherein the lithographic apparatus further includes, or is in connection with, the radiation source or fluid stream generator as described above.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate the present invention, and, together with the description, further serve to explain the principles of the invention and to enable a person skilled in the relevant art(s) to make and use the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which may be read and executed by one or more processors. A machine-readable medium can include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Figure 1:
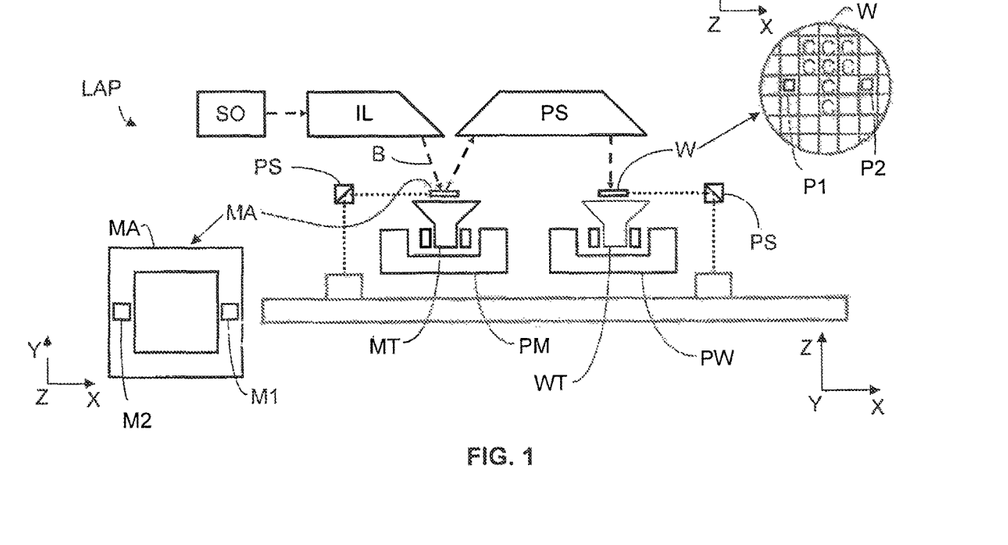
FIG. 1 depicts a lithographic apparatus according to an embodiment of the present invention.

FIG. 1 schematically depicts a lithographic apparatus LAP including a source collector module SO according to an embodiment of the present invention. The apparatus includes an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

In this embodiment, for example, the apparatus is of a reflective type (e.g., employing a reflective mask).

The lithographic apparatus may be of a type having two (dual stage) or more substrate tables and for example, two or more mask tables. In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of a EUV radiation system including a laser, not shown in FIG. 1, for providing the laser beam and exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent, which are commonly referred to as σ-outer and σ-inner, respectively, of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.
2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.
3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
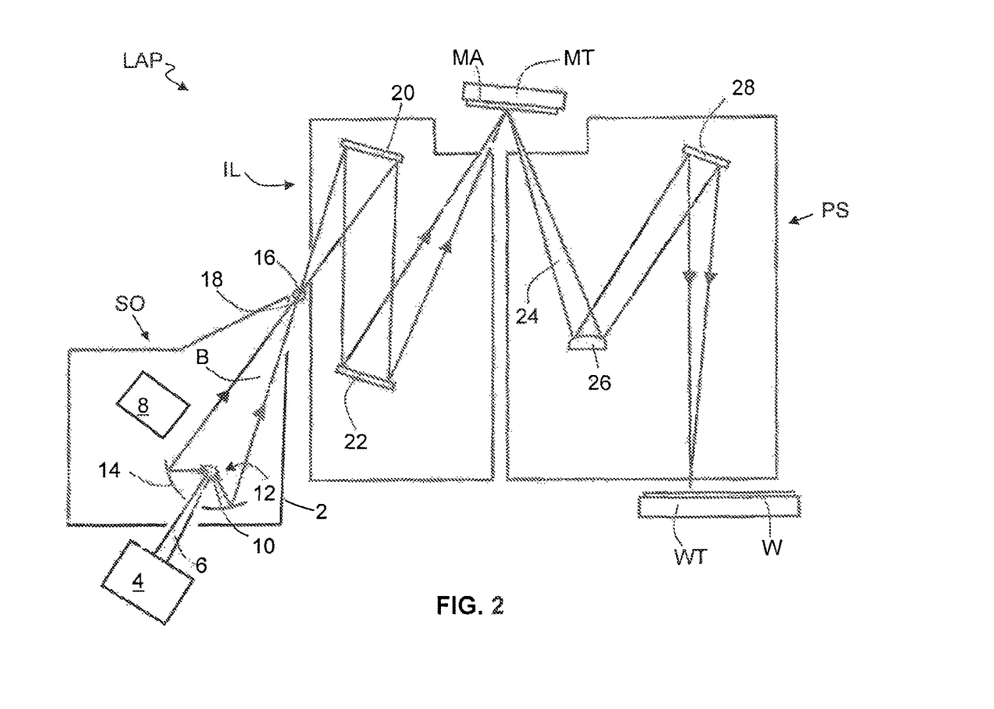
FIG. 2 is a more detailed view of the apparatus of FIG. 1, including an LPP source collector module, according to an embodiment of the present invention.

FIG. 2, according to an embodiment of the present invention, shows the lithographic apparatus LAP in more detail, including the source collector module SO, the illumination system IL, and the projection system PS. The source collector module SO is constructed and arranged such that a vacuum environment can be maintained in an enclosing structure 2 of the source collector module.

A laser 4 is arranged to deposit laser energy via a laser beam 6 into a fuel, such as xenon (Xe), tin (Sn) or lithium (Li) that is provided from a fluid stream generator 8. Liquid (i.e., molten) tin, which can be in the form of droplets, or another metal in liquid form, appears to be the most promising and thus likely choice of fuel for EUV radiation sources. The deposition of laser energy into the fuel creates a highly ionized plasma 10 at a plasma formation location 12 which has electron temperatures of several tens of electronvolts (eV). The energetic radiation generated during de-excitation and recombination of these ions is emitted from the plasma 10, collected and focused by a near normal incidence radiation collector 14. A laser 4 and fluid stream generator 8 (and/or a collector 14) can together be considered to comprise a radiation source, specifically a EUV radiation source. The EUV radiation source can be referred to as a laser produced plasma (LPP) radiation source.

In an embodiment, a second laser (not shown) can be provided, the second laser being configured to preheat the fuel before the laser beam 6 is incident upon it. An LPP source which uses this approach may be referred to as a dual laser pulsing (DLP) source.

Although not shown, the fuel stream generator will comprise, or be in connection with, a nozzle configured to direct a stream of, for example, fuel droplets along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing structure 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

In and embodiment, additional elements can be present in the illumination system IL and projection system PS. Furthermore, there may be more mirrors present than those shown in the figures, for example there may be 1-6 additional reflective elements present in the projection system PS than shown in FIG. 2.

Figure 3:
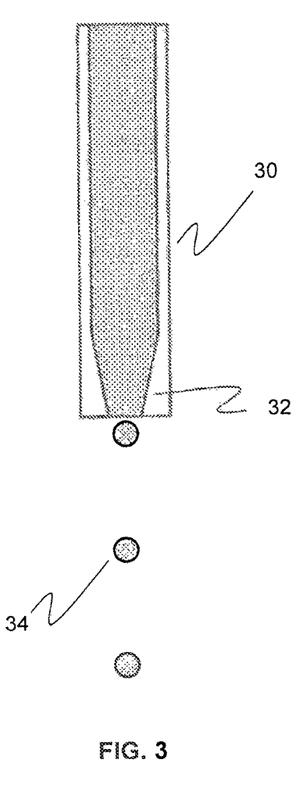
FIG. 3 schematically depicts a nozzle of a radiation source configured to direct a stream of fuel droplets along a trajectory towards a plasma formation location, according to an embodiment of the present invention.

FIG. 3, according to an embodiment of the present invention, schematically depicts a part of the fuel stream generator as shown in and described with reference to FIG. 2. The part of the fuel stream generator is shown as comprising a conduit 30 which includes and leads to a nozzle 32 configured to direct a stream of droplets of fuel 34 along a trajectory towards a plasma formation location (not shown). In another example, the same (or a modified) part of the fuel stream generator may provide a continuous stream of fuel.

Stability and/or clogging (i.e., at least partial blocking) of nozzle 32 are issues that may arise during use of nozzle 32, as they do for any ink jet printing application. Clogs will be formed by contamination in the fuel. Clogging of nozzle 32 may impose a lifetime limit on the nozzle and thus the fuel stream generator (or at least a time limit at which limit replacement, maintenance, or cleaning is required) and may therefore limit the availability of the radiation source or the lithographic apparatus as a whole.

It is most likely nozzle 32 of the fuel stream generator will have the smallest, or one of the smallest, diameters as compared to other conduits and the like of a fuel flow system forming part of the fuel stream generator. Since the nozzle 32 will have one of the smallest diameters, it is likely that clogging in a fuel flow path will occur near or at nozzle 32, and likely within nozzle 32 which is a restriction in the fuel flow system. Such clogging might result in a change in the effective geometry of the nozzle.

A change in effective geometry may result in a change in the parameters of the generated stream/stream of droplets, for instance droplet or stream shape or size, or most likely a direction of trajectory of the stream/stream of droplets. In many applications, such parameters will need to meet stringent requirements. In a EUV radiation source in particular, the requirements of the droplet generator will be extremely stringent in terms of the trajectory of the droplet stream. For instance, at a plasma formation location, the location of a droplet may need to be accurate to within a few microns, but at the same time nozzle 32 itself may need to be located relatively far away from the plasma formation location, for instance by a distance of a few tens of centimeters or so. This results in a direction stability requirement of the trajectory of the stream of droplets of perhaps less than 10 microradians. The overall result is that even very small particulate contamination deposited on an internal surface of the nozzle can change the effective geometry of the nozzle to such an extent to ensure that the direction stability requirement is not met. This might, in turn have a detrimental affect on the operation of the radiation source and thus the lithographic apparatus as a whole, for example in terms of the generation of radiation.

Figure 4:
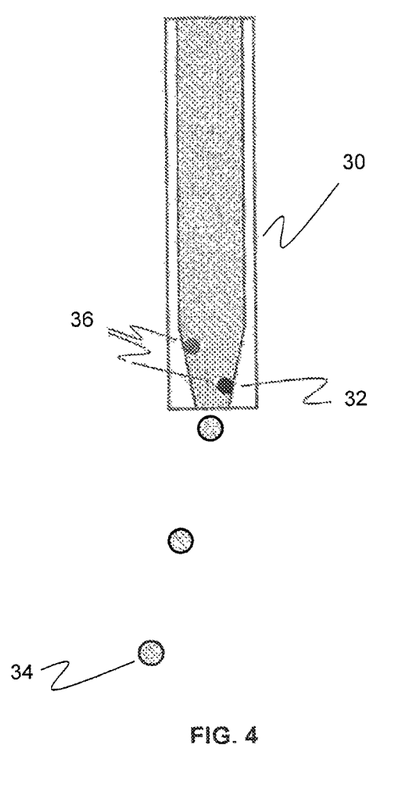
FIG. 4 schematically depicts contamination deposition on an internal surface of the nozzle of FIG. 3, and an effect on a trajectory of droplets leaving the nozzle, according to an embodiment of the present invention.

FIG. 4, according to an embodiment of the present invention, schematically depicts the same conduit 30, nozzle 32 and droplet stream 34 as shown in and described with reference to FIG. 3. However, in FIG. 4 contamination in the form of particles 36 has become deposited on an internal surface of nozzle 32. Such deposition has resulted in a change in the effective geometry of nozzle 32 (as described above), which has resulted, in turn, in a change in trajectory of the stream of droplets 34.

Particles 36 are one example of contamination. The contamination could be particulate in form, or be anything else which might be present within the fuel used to form droplet stream 34 (e.g., flakes, agglomerations, or the like). The contamination could arise from oxidization of the fuel. For example, if the fuel is tin (or another molten metal), the contamination may be tin oxide particles (or oxides of whatever metal is used) or the like. Alternatively and/or additionally, the contamination could be particles or the like of materials from apparatus used upstream within the fuel flow system.

Even if the contamination within the fuel does not result in a change in an effective geometry of a nozzle, contamination might have other detrimental effects. For instance, contamination in the generated fuel stream might result in a reduction in conversion efficiency in a radiation source (e.g., the amount of radiation generated when the stream is targeted by a laser). Alternatively and/or additionally, the contamination might leave the fuel stream generator and contaminate more contamination sensitive components or the like located outside of that generator, for example a collector of a radiation source, or one or more other components of a lithographic apparatus.

Thus, and in summary, in such a fuel stream generator it is desirable to prevent the nozzle from being clogged with contamination, thus preventing a change of effective geometry of the nozzle. Alternatively or additionally, it is an object of the present invention to prevent contamination passing through and leaving the nozzle, thus preventing contamination of components external to the fuel stream generator.

Figure 5:
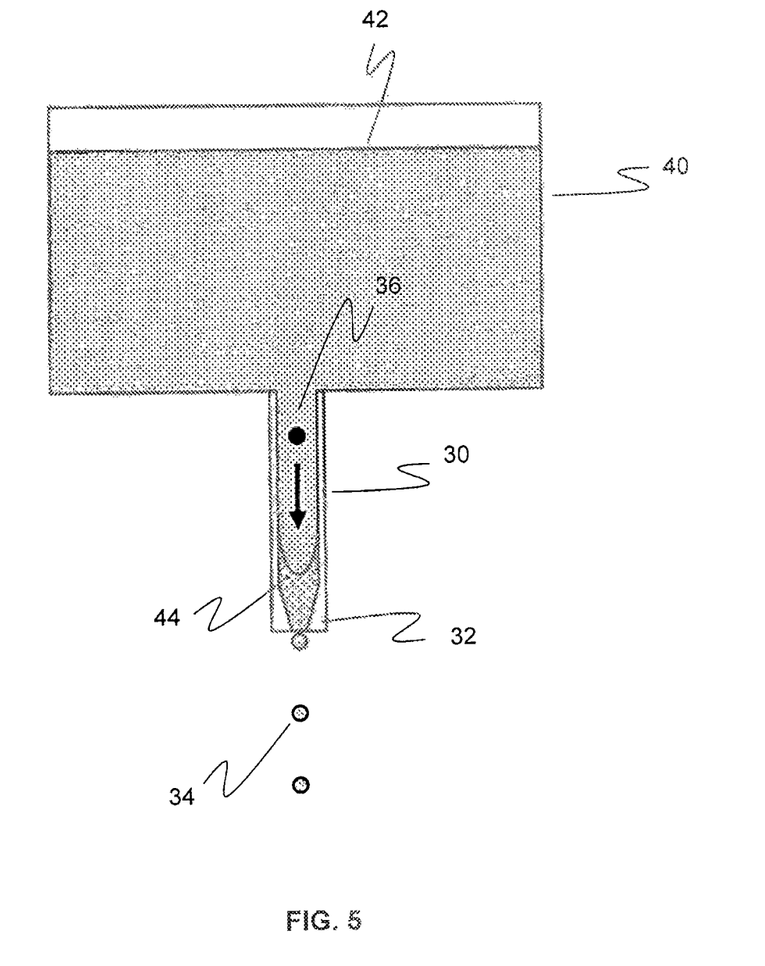
FIG. 5 schematically depicts a fluid stream generator comprising a contamination filter assembly, according to an embodiment of the present invention.

FIG. 5, according to an embodiment of the present invention, schematically depicts a fluid stream generator of a radiation source. The fluid stream generator includes a reservoir 40 configured to retain a volume of fuel 42 used in the generation of radiation (e.g., a molten metal such as tin). Reservoir 40 is in fluid connection with (i.e., able to supply fuel to) the conduit 30 and nozzle 32 already shown in and described with reference to FIGS. 3 and 4 above. Referring back to FIG. 5, pressure may be applied to the fuel 42 (e.g., mechanical or fluid pressure) to force ejection of fuel 42 through the nozzle 32.

In an attempt to prevent contamination 36 from reaching the nozzle 32 and thus passing through the nozzle 32, a filter assembly 44 is located in a fuel flow path of the fluid stream generator, upstream of an outlet of the nozzle 32. As shown in FIG. 5, filter assembly 44 is usually located, but does not have to be, close to nozzle 32 (e.g., between the reservoir 40 and the nozzle 32) to ensure that at this late stage of the fuel flow path contamination is prevented from passing to the nozzle 32. One or more further filter assemblies may also be provided (not shown) further upstream in the fuel flow path and within the fuel stream generator.

Figure 6:
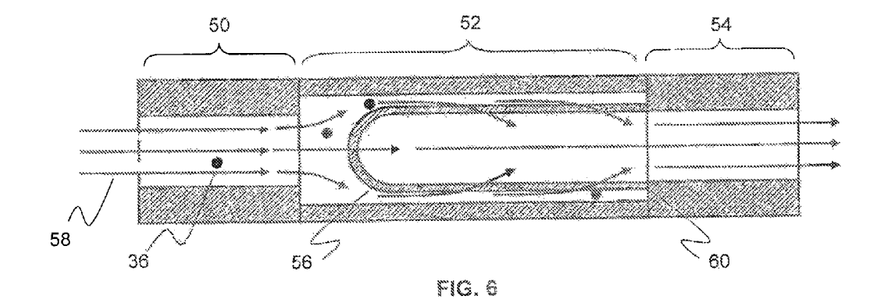
FIG. 6 schematically depicts a contamination filter assembly suitable for use in the fluid stream generator as shown in and described with reference to FIG. 5, according to an embodiment of the present invention.

FIG. 6, according to an embodiment of the present invention, is a cross-sectional view of an in-line contamination filter assembly, such as that shown in FIG. 5. Referring back to FIG. 6, the contamination filter assembly includes an inlet 50, a filter medium housing 52 and an outlet 54. Filter medium housing 52 houses a filter medium 56. Filter medium 56 will usually at least partially extend in a direction substantially parallel to a direction of fluid flow, and does not or does not necessarily simply extend across housing 52. This increases the area of filter medium 56 available for filtration of contamination 36 located within fluid flow 58. This is also the case for other embodiments of the present invention, which will be discussed further below.

Although shown as being separate entities, one or more of inlet 50, filter medium housing 52 and/or outlet 54 may be integrally formed with one another, and/or may be an integral part of a conduit for carrying fluid through the fluid stream generator. This principle is equally applicable to embodiments of the present invention that will be described in detail below.

Referring back to FIG. 6, in order to keep filter medium 56 in position, filter medium 56 is brazed or welded 60 to another part of the contamination filter assembly, in this case to outlet 54.

Filter medium 56 is formed from a material that is generally expected to be capable of withstanding conditions that will be experienced during normal use. For instance, if the fuel to be used is a molten metal, filter medium 56 will be expected to able to maintain structural integrity and the like at temperatures above and beyond those at which the fuel is molten. At the same time, filter medium 56 will need to be able to successfully filter out contamination 36 from fluid flow 58. In order to achieve these aims, it has been proposed to use as filter medium 56 a metal with a high melting temperature.

In use, the contamination filter assembly of FIG. 6 has been found to, in general, successfully filter out contamination 36 within fluid flow 58 generated upstream of filter medium 56, thus preventing such contamination 36 from reaching and clogging or passing through the nozzle of the fluid flow system. However, a number of problems have been encountered in conjunction with the use of the filter assembly. One such problem that has been found relates to the method by which filter medium 56 is attached or retained within the filter assembly. When welding or brazing 60 is used, it has been found that residues or the like from the welding or brazing process contaminate the fuel flow after the filtration stage, which can lead to such new contamination reaching the nozzle, and either clogging the nozzle or entering the more contamination-sensitive regions of, for example, the radiation source. Additionally, and perhaps surprisingly, the high melting temperature metal that has so far been expected to function well as filter medium 56 has been found to dissolve slightly in the fuel (e.g., molten metal in the form of tin or the like). This dissolving results in the filter medium itself providing additional contamination that may pass into the nozzle and result in clogging of the nozzle or contamination passing into the more contamination-sensitive regions of the, for instance, radiation source.

It is an object of the present invention to obviate or mitigate the abovementioned problems, or at the least to provide an alternative contamination filter assembly for use in a fluid stream generator and, in particular, in a fluid stream generator in which the fuel is at a high temperature (for example over 100° C. or in excess of 200° C. or the like). For instance, these are the sort of conditions found in a fluid stream generator or radiation source as described above, and/or where the fluid is a molten metal.

In accordance with the present invention, there are provided at least two separate solutions to the abovementioned problems. These solutions may be used independently or in combination as and where appropriate. With regards to the means by which the filter medium is attached or contained within a contamination filter assembly, a solution according to the present invention is to hold that filter medium in place within the contamination filter assembly by use of a clamping force provided by one or more objects that at least partially surround the filter medium in use. This avoids the need to use welding or brazing, which has been found to be the source of additional contamination. With regard to the problems encountered with the contamination generated by the filter medium itself, the solution provided by the present invention is to provide a filter medium of a contamination filter assembly that is or comprises a ceramic material, which is far more inert than a metal-based filter medium (especially at the temperatures at which, for example, a molten metal fuel flows).

Embodiments of the present invention will now be described with reference to FIGS. 7 to 12. In those Figures the same features have been given the same reference numerals for consistency and clarity. The Figures have not been drawn to any particular scale.

Figure 7:
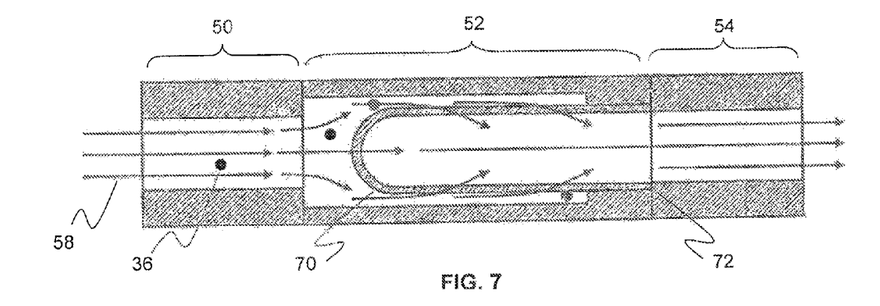
FIG. 7 schematically depicts a contamination filter assembly in accordance with an embodiment of the present invention, suitable for use with the fluid stream generator as shown in and described with reference to FIG. 5, according to an embodiment of the present invention.

FIG. 7 shows a contamination filter assembly according to an embodiment of the present invention. In this embodiment a filter medium 70 is or comprises a ceramic material. The ceramic material can include zirconia, which has been found to have a large coefficient of thermal expansion which matches that of metals which may be used to form one or more of the inlet 50, outlet 54 or housing 52. This might minimize differential thermal expansion in use, which would otherwise lead to a loss of structural integrity of the contamination filter assembly. In an embodiment, an alumina ceramic might instead be used, such a ceramic being relatively easy to manufacture. Other ceramics that might be used might include (but are not restricted to) silicon-carbide, silicon-nitride, or an oxide ceramic. In use, such a ceramic-based filter medium 70 is far less likely to dissolve or otherwise degrade in the presence of fuel that is being filtered, and is thus far less likely to generate additional contamination in comparison with, for instance, a metal filter medium or the like.

Filter medium 70 might have a pore (or gauge) size of less than or equal to 20 µm, less than or equal to 5 µm, or less than or equal to 1 µm. The pore size will depend on the environment in which the filter is used, and the size of contamination that might need to be filtered. For applications with high contamination sensitivity, for example in the generation of EUV radiation, a pore size of less than or equal to 5 µm, or most likely less than or equal to 1 µm might be preferred.

Another advantageous feature of the contamination filter assembly of FIG. 7 is the manner by which filter medium 70 is retained within the contamination filter assembly. In this embodiment, filter medium 70 is held in place 72 within the contamination filter assembly by a clamping force 72 provided by housing 52 that surrounds filter medium 70 (e.g., by a lip 52 of that housing, or the like). This clamping force may be achieved in one of a number of ways, for instance by providing a band or the like that surrounds housing 52 which is used to apply the required clamping force between housing 52 and filter medium 70. However, a particularly convenient and appropriate way of achieving the required clamping force has been found to involve the shrink-fitting of housing 52 (or whichever object or objects at least partially surround filter medium 70 in use) around filter medium 70. This avoids the need to use brazing or welding to retain filter medium 70 in position, and thus removes another potential source of contamination. This also allows for filter medium 70 to be readily incorporated within, and removed from, the filter assembly.

Figure 8:
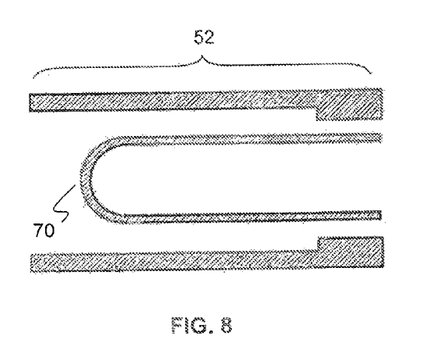
FIGS. 8 and 9 schematically depict principles of assembly of the filter assembly of FIG. 7, according to an embodiment of the present invention.
Figure 9:
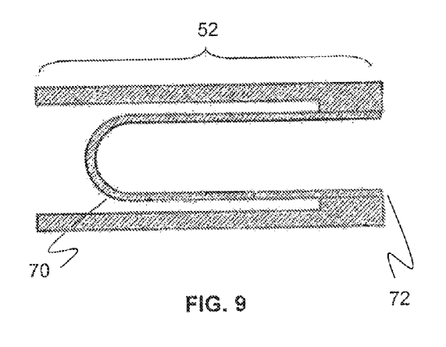

FIGS. 8 and 9 show how a filter medium 70, according to an embodiment of the present invention, can be incorporated within a contamination filter assembly. Referring to FIG. 8, housing 52 is heated to cause expansion of housing 52 to an extent that would allow a filter medium 70 to be located in a position whereby housing 52 (or at least the part thereof that will clamp on filter medium 70) can surround filter medium 70. Filter medium 70 is then located in that position. FIG. 9 shows that housing 52 is then cooled or allowed to cool, such that housing 52 comes into contact with, shrink fits around and thus supplies a clamping force to filter medium 70.

Preferably, the heating required to expand housing 52 (e.g., to an extent required to insert the filter medium within a clampable position within housing 52) is in excess of an operating temperature of the filter assembly. This ensures that the clamping force that results is maintained during operation of the filter at this operating temperature.

As and when required, filter medium 70 may be removed from the filter assembly by implementing effectively the reverse process described in relation to FIGS. 8 and 9. That is, the method for removing the filter medium 70 might comprise heating housing 52 to cause expansion thereof to such an extent that filter medium 70 is removable, and then removing filter medium 70.

It will be appreciated that in accordance with the present invention, the filter medium can be readily incorporated or removed from the filter assembly, meaning that the filter medium can be easily replaced, maintained or the like, and in a far more straightforward manner than if the filter medium was (or were to be) brazed or welded in position.

As described above, the use of a ceramic material for the filter medium is advantageous. For the same or similar reasons, one or more internal surfaces of filter medium housing 52 may be provided with ceramic in the form of a ceramic coating or a ceramic insert. If the housing is formed from a ceramic then, of course, the internal surface will present a ceramic surface. The housing may then be formed from another material, such as a metal, while at the same time not providing an additional source of contamination during use, since the internal surfaces will be provided with the more inert ceramic material.

Figure 10:
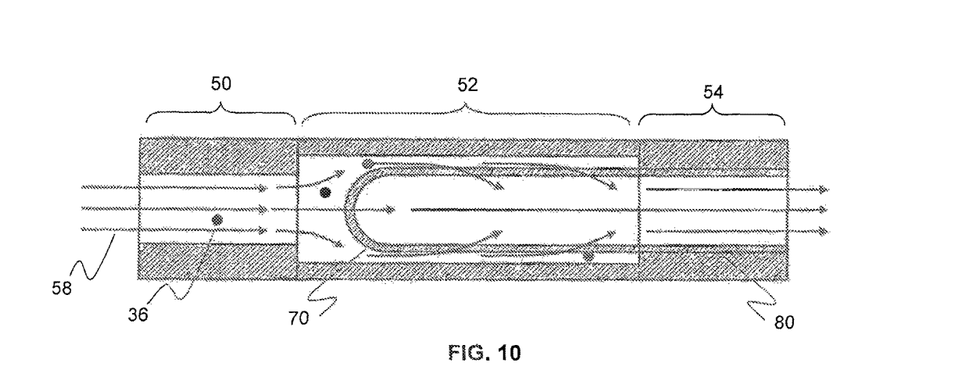
FIGS. 10 to 12 schematically depict alternative embodiments of a filter assembly according to an embodiment of the present invention.
Figure 11:
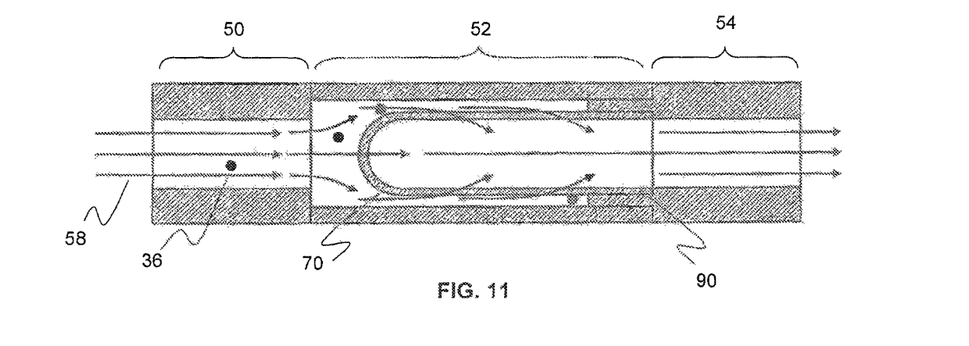
Figure 12:
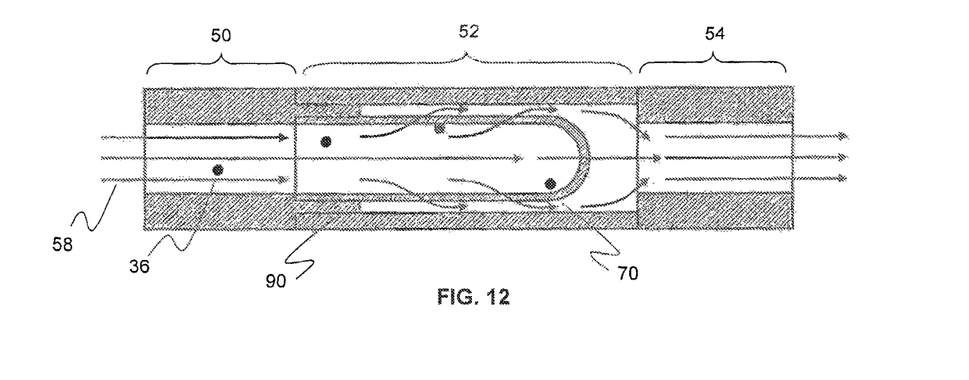

In FIGS. 7 to 9, according to an embodiment, the filter medium has been shown as being retained in position by the housing. However, one or more other objects that would surround the filter medium in use may be used to retain the filter medium in position, and using the same principles as discussed above in relation to FIGS. 7 to 9 (e.g., by the application of a clamping force resulting from, for instance, shrink-fitting or the like). For instance, FIG. 10 shows how outlet 54 may provide a clamping force 80. Alternatively, FIG. 11 shows that a clamping force 90 may be provided by a portion of outlet 54 that is itself surrounded by a portion of housing 52. Alternatively, the filter medium 70 may slip into a portion of outlet 54, and a portion of housing 52 that surrounds that portion of outlet 54 may apply the required clamping force 90 to the portion of outlet 54, and in turn the filter medium 70. FIG. 12 shows how the same principles may be applied when the filter medium 70 is retained in position using at least a portion of inlet 50, the arrangement shown in FIG. 12 being almost a mirror-image of the arrangement shown in FIG. 11.

A support or the like may be provided on an opposite side of the filter medium to which the clamping force is applied, to minimize the risk of damaging the filter medium. The support may be provided by another part of the assembly, for example the outlet/inlet if the housing provides the clamping force.

Components of the filter assembly other than the filter medium may be connected to one another using a screw fit or the like. Such a screw fit may not be possible for the filter medium itself, due to its potentially fragile nature and/or the difficulty in providing a screw-thread in such a material. Alternatively or additionally, other components of the contamination filter assembly could be shrink fitted to one another, for example the inlet to the housing, the housing to the inlet, the outlet to the housing, the housing to the outlet, or the like.

A ceramic slurry or polyimide seal may be located in-between the filter medium and one or more surrounding objects during a clamping process, so that when the clamping force is applied there is a good seal between the filter medium and the one or more surrounding objects, maintained during use. As already discussed, ceramic is relatively inert and will thus provide little or no contamination, even at temperatures of molten tin or the like. Similarly, a polyimide seal will provide little or no contamination (and certainly less contamination than would be provided by a braze or weld) at these temperatures.

As described above, the use of a ceramic material forming the filter medium may be used in combination with, or independently from, the principle of retaining the filter medium in position using a clamping force (e.g., by shrink-fitting). Of course, increased contamination reduction may be achieved by using the two different approaches in combination.

In the Figures, the reservoir, conduit and nozzle are shown as having a substantially vertical orientation. However, other orientations are possible, for example a substantially horizontal orientation, or orientation at another angle.

In the Figures, the nozzle is shown as extending from the reservoir via the conduit. In another embodiment, the nozzle could extend directly from the conduit, or could form a part of the conduit (e.g., the nozzle could be formed in a wall of the conduit).

In some of the embodiments, reference has been made to the fuel being or comprising liquid tin, and contamination being or comprising particles or the like of tin oxide. However, the invention may be applicable to other types of liquid/fuel, for example inks or a molten metal, with contamination potentially comprising an oxide of that ink or metal. The invention is particularly suited to use in fluid stream generators where the fluid is a molten metal, given the ability of ceramics to withstand temperatures at which metals are molten, and also due to a shrink fit (for the filter medium) having advantages at those temperatures which perhaps other binding techniques (e.g., welding or brazing) do not (e.g., there being no binding material to be dislodged at high temperatures).

Although the abovementioned embodiments have been described in relation to a radiation source, the invention may be applicable and particularly useful in other applications where nozzles for use in fluid stream generators are required, for example in the field of ink jet printing, or metal printing, or the like. Implementation in relation to a radiation source might be particularly preferred however, given the sensitivity of such apparatus to contamination.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens," where the context allows, can refer to any one or combination of various types of optical components, including refractive, reflective, magnetic, electromagnetic and electrostatic optical components.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building storing blocks illustrating the implementation of specified functions and relationships thereof. The boundaries of these functional building storing blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A radiation source comprising:
    a reservoir configured to retain a volume of a fuel;
    a nozzle, in fluid connection with the reservoir, configured to direct a stream of the fuel along a trajectory towards a plasma formation location; and
    a contamination filter assembly, located in a fuel flow path between the reservoir and the nozzle, configured to:
        be expanded to a first volume at a first temperature, and
        be reduced to a second volume at a second temperature, the first and second volumes being different from each other, and the first and second temperatures being different from each other,
    wherein the contamination filter assembly comprises a filter medium configured to:
        be held in place within the contamination filter assembly by a force provided by an inlet or an outlet of the contamination filter assembly that at least partially surrounds the filter medium in response to the contamination filter assembly being reduced to the second volume; and
        be removed from the contamination filter assembly in response to the contamination filter assembly being expanded to the first volume.

2. The radiation source of claim 1, wherein the filter medium comprises a ceramic material having zirconia, alumina, silicon carbide, or silicon-nitride.

3. The method of claim 1, wherein the first temperature is greater than an operating temperature of the filter medium such that the force is maintained during operation of the filter medium.

4. The radiation source of claim 1, wherein the fuel is a molten metal.

5. The radiation source of claim 1, wherein the Filter medium at least partially extends in a direction substantially parallel to a direction of the fuel flow path.

6. The radiation source of claim 1, wherein a ceramic slurry or polyimide seal is located in-between the filter medium and the one or more objects.

7. The radiation source of claim 1, wherein the filter medium has an average pore size of less than or equal to about 20 µm, less than or equal to about 5 µm, or less than or equal to about 1 µm.

8. The radiation source of claim 1, further comprising a laser radiation assembly configured to direct laser radiation at the stream of the fuel at the plasma formation location to generate a radiation generating plasma.

9. A fluid stream generator comprising:
a reservoir configured to retain a volume of a fluid;
a nozzle, in fluid connection with the reservoir, configured to direct a stream of the fluid along a trajectory; and
a contamination filter assembly, located in a fluid flow path between the reservoir and the nozzle, configured to:
be expanded to a first volume at a first temperature, and
be reduced to a second volume at a second temperature, the first and second volumes being different from each other, and the first and second temperatures being different from each other,
wherein the contamination filter assembly comprises a filter medium configured to:
be held in place within the contamination filter assembly by a force provided by an inlet or an outlet of the contamination filter assembly that at least partially surrounds the filter medium in response to the contamination filter assembly being reduced to the second volume; and
be removed from the contamination filter assembly in response to the contamination filter assembly being expanded to the first volume.

10. A method comprising:
expanding a housing of a contamination filter assembly of a radiation source to a first volume;
incorporating a filter medium in the expanded housing of the contamination filter assembly;
shrinking the housing of the contamination filter assembly to a second volume; and
holding the filter medium in a position within the contamination filter assembly by a force provided by an inlet or an outlet of the contamination filter assembly that at least partially surrounds the filter medium.

11. The method of claim 10, wherein:
the expanding of the contamination filter assembly comprises heating the inlet or the outlet of the contamination filter assembly that at least partially surrounds the filter medium in order to cause expansion of the inlet or the outlet to an extent that allows the filter medium to be placed in the contamination filter; and
the shrinking of the contamination filter assembly comprises cooling, or allowing to cool, the inlet or the outlet to an extent such that the inlet or the outlet applies the force to the filter medium.

12. A radiation source comprising:
a contamination filter assembly, located in a fuel flow path of the radiation source, configured to:
be expanded to a first volume at a first temperature, and
be reduced to a second volume at a second temperature, the first and second volumes being different from each other, and the first and second temperatures being different from each other,
wherein the contamination filter assembly comprises a filter medium configured to:
be inserted into the contamination filter assembly in response to the contamination filter assembly being expanded to the first volume; and
be held in place within the contamination filter assembly by a force provided by an inlet or an outlet of the contamination filter assembly that at least partially surrounds the filter medium in response to the contamination filter assembly being reduced to the second volume.

13. The radiation source of claim 12, wherein one or more internal surfaces of the contamination filter assembly comprise a ceramic material.

14. The radiation source of claim 12, wherein the filter medium comprises a ceramic material having zirconia, alumina, silicon carbide, or silicon-nitride.

15. The radiation source of claim 12, further comprising:
a reservoir configured to retain a volume of the fuel;
a nozzle, in fluid connection with the reservoir, configured to direct a stream of the fuel along a trajectory towards a plasma formation location, wherein the contamination filter assembly is located between the reservoir and the nozzle; and
a laser radiation assembly configured to direct laser radiation at the stream at the plasma formation location to generate a radiation generating plasma.

16. The radiation source of claim 12, wherein the first temperature is greater than an operating temperature of the filter medium, such that the force is maintained during operation of the filter medium.

17. A fluid stream generator comprising:
a contamination filter assembly, located in a fluid flow path of the fluid stream generator, configured to:
be expanded to a first volume at a first temperature, and
be reduced to a second volume at a second temperature, the first and second volumes being different from each other, and the first and second temperatures being different from each other,
wherein the contamination filter assembly comprises a filter medium configured to:
be inserted into the contamination filter assembly in response to the contamination filter assembly being expanded to the first volume; and
be held in place within the contamination filter assembly by a force provided by an inlet or an outlet of the contamination filter assembly that at least partially surrounds the filter medium in response to the contamination filter assembly being reduced to the second volume.

18. The fluid stream generator of claim 17, further comprising:
a reservoir configured to retain a volume of the fluid;
a nozzle, in fluid connection with the reservoir, configured to direct a stream of the fluid along a trajectory, wherein the contamination filter assembly is located between the reservoir and the nozzle.

19. A lithographic apparatus comprising:
an illumination system configured to provide a radiation beam;
a patterning device configured to impart the radiation beam with a pattern in its cross-section;
a substrate holder configured to hold a substrate;
a projection system configured to project the patterned radiation beam onto a target portion of the substrate,
a reservoir configured to retain a volume of a fuel;
a nozzle, in fluid connection with the reservoir, configured to direct a stream of the fuel along a trajectory towards a plasma formation location; and
a contamination filter assembly located in a fuel flow path between the reservoir and the nozzle, configured to:
be expanded to a first volume at a first temperature, and
be reduced to a second volume at a second temperature, the first and second volumes being different from each other, and the first and second temperatures being different from each other,
wherein the contamination filter assembly comprises a filter medium of the contamination filter assembly configured to:

be inserted into the contamination filter assembly in response to the contamination filter assembly being expanded to the first volume; and be held in place within the contamination filter assembly by a force provided by an inlet or an outlet of the contamination filter assembly that at least partially surrounds the filter medium in response to the contamination filter assembly being reduced to the second volume.

20. The lithographic apparatus of claim 19, further comprising a laser radiation assembly configured to direct laser radiation at the stream of the fuel at the plasma formation location to generate a radiation generating plasma.

* * * * *

UNITED STATES PATENT AND TRADEMARK OFFICE
CERTIFICATE OF CORRECTION

PATENT NO. : 9,655,222 B2
APPLICATION NO. : 13/599494
DATED : May 16, 2017
INVENTOR(S) : Van Den Akker et al.

It is certified that error appears in the above-identified patent and that said Letters Patent is hereby corrected as shown below:

In the Claims

In Column 16, Line 54, Claim 5 after "wherein the" please delete "Filter" and insert --filter--.

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*